United States Patent

Ichiyoshi

[11] Patent Number: 5,119,037
[45] Date of Patent: Jun. 2, 1992

[54] HIGH SPEED PHASE-LOCK LOOP DEVICE
[75] Inventor: Osamu Ichiyoshi, Tokyo, Japan
[73] Assignee: NEC Corporation, Tokyo, Japan
[21] Appl. No.: 704,531
[22] Filed: May 23, 1991
[30] Foreign Application Priority Data May 23, 1990 [JP] Japan ................... 2-133208

[51] Int. Cl.[5] .................... H03K 5/13; H03K 5/22
[52] U.S. Cl. ........................ 328/155; 328/63; 307/262; 307/269; 375/120
[58] Field of Search .......... 307/262, 269; 328/155, 328/63, 72; 331/1 A; 357/119, 120

[56] References Cited

U.S. PATENT DOCUMENTS 4,924,188 5/1990 Akazawa et al. .............. 329/155

Primary Examiner—Timothy P. Callahan
Attorney, Agent, or Firm—Sughrue, Mion, Zinn, Macpeak & Seas

[57] ABSTRACT

A phase-lock loop device for phase locking a device input signal representing a first complex number and having a device input phase which should be locked into a locked phase, includes the following. A first complex multiplier to calculate a first product of the first complex number and a first conjugate complex number to produce a first complex product signal. The first conjugate complex number is represented by a first conjugate signal which is produced by delaying and processing the device input signal. A second complex multiplier to calculate a second product of a phase processed signal and a multiplier input signal to produce a second complex product signal. The phase processed signal is produced by filtering and processing the first complex product signal. The multiplier input signal is produced by delaying and limiting the second complex product signal. A third complex multiplier to calculate a third product of the first complex number and a second conjugate complex number to produce a third complex product signal. The second conjugate complex number is represented by a second conjugate signal which is produced by processing the second complex product signal. A fourth complex multiplier to calculate a fourth product of the second complex product signal and a filtered signal to produce a fourth complex product signal having the locked phase. the filtered signal is produced by filtering the third complex product signal.

6 Claims, 1 Drawing Sheet

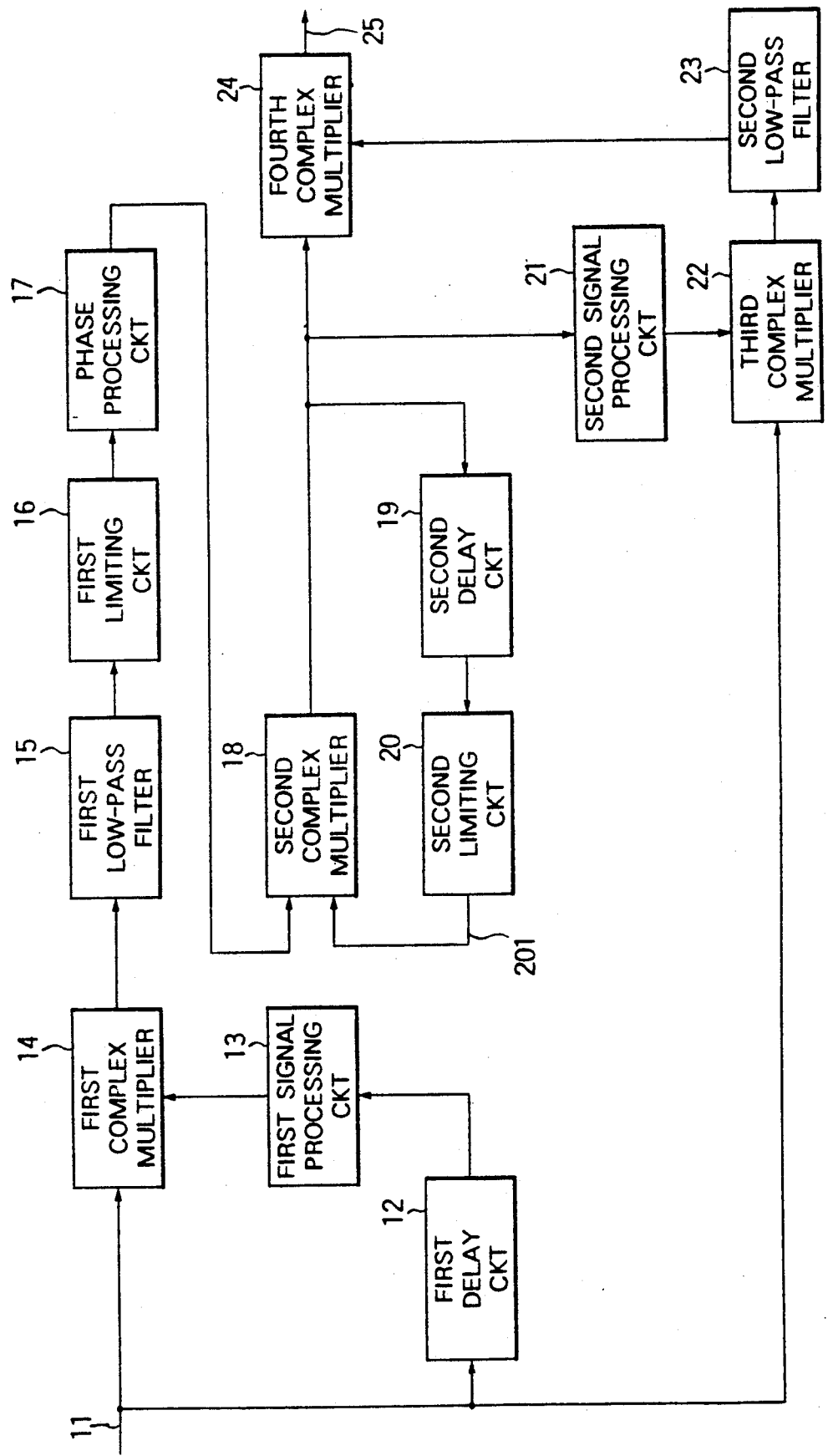

HIGH SPEED PHASE-LOCK LOOP DEVICE

BACKGROUND OF THE INVENTION

The present invention relates to a phase-lock loop device which is for phase locking a device input signal representing a device input complex number and having a device input phase into a phase locked signal representing another complex number and having a locked phase which are related to the device input complex number and the device input phase.

A conventional phase-lock loop device of the type described, generally comprises a complex multiplier, a low-pass filter, an integrator, and a complex converter.

The complex multiplier is supplied with the device input signal and a multiplier input signal which will be presently be described. The complex multiplier calculates a product of the device input signal and the multiplier input signal to produce a complex product signal representative of the product.

The low-pass filter is connected to the complex multiplier to filter the complex product signal into a filtered signal. The integrator is connected to the low-pass filter and integrates the filtered signal into an integrated signal.

The complex converter is connected to the integrator and converts the integrated signal to a converted signal to deliver the converted signal back to the complex multiplier as the multiplier input signal.

In the conventional phase-lock loop device, it will be assumed that the device input signal has a frequency greatly different from that of the multiplier input signal. In this event, operation of locking the device input phase is impossible or, if possible, will take a very long time.

SUMMARY OF THE INVENTION

It is therefore an object of the present invention to provide a phase-lock loop device which is capable of phase locking a device input signal in a short period of time.

Other objects and advantages of this invention will become clear as the description proceeds.

On describing this invention, one should understand that a phase-lock loop device is for phase locking a device input signal representing a first complex number and having a device signal phase which should be locked into a locked phase.

According to this invention, the above-understood phase-lock loop device comprises (A) a first delay circuit supplied with the device input signal for delaying the device input signal by a delay time to produce a first delayed signal having a first phase, (B) a first signal processing circuit connected to the first delay circuit for processing the first delayed signal into a first conjugate signal representative of a first conjugate complex number of the first complex number, (C) a first complex multiplier connected to the first signal processing circuit for calculating a first product of the first complex number and the first conjugate complex number to produce a first complex product signal representative of the first product, (D) a first low-pass filter connected to the first complex multiplier for filtering the first complex product signal into a first filtered signal having the first phase, (E) phase processing means connected to the first low-pass filter for processing the first phase into a processed phase which is equal to the device input phase, the phase processing means thereby producing a phase processed signal representative of the processed phase, (F) a second complex multiplier connected to the phase processing means and supplied with a multiplier input signal for calculating a second product of the phase processed signal and the multiplier input signal, the second product being representative of a second complex number, the second complex multiplier thereby producing a second complex product signal representative of the second product, (G) a second delay circuit connected to the complex multiplier for delaying the second complex product signal to produce a second delayed signal having a delayed signal amplitude, (H) limiting means connected to the second complex multiplier and the second delay circuit for limiting the delayed signal amplitude into a limited amplitude to deliver a limited signal having the limited amplitude to the second complex multiplier as the multiplier input signal, (I) a second signal processing circuit connected to the second complex multiplier for processing the second complex product signal into a second conjugate signal representative of a second conjugate complex number of the second complex number, (J) a third complex multiplier connected to the second signal processing circuit and supplied with the device input signal for calculating a third product of the first complex number and the second conjugate complex number to produce a third complex product signal representative of the third product, (K) a second low-pass filter connected to the third complex multiplier for filtering the third complex product signal into a second filtered signal, and (L) a fourth complex multiplier connected to the second complex multiplier and the second low-pass filter for calculating a fourth product of the second complex product signal and the second filtered signal to produce a fourth complex product signal representative of the fourth product, the fourth complex product signal having the locked phase.

BRIEF DESCRIPTION OF THE DRAWING

FIG. 1 is a block diagram of a phase-lock loop device according to an embodiment of the present invention.

DESCRIPTION OF THE PREFERRED EMBODIMENT

Referring to FIG. 1, attention will be directed to a phase-lock loop device according to a preferred embodiment of the present invention. The phase-locked loop device is for phase locking a device input signal 11 representing a first complex number and having a device input phase which should be locked into a locked phase.

The phase-lock loop device comprises a first delay circuit 12 supplied with the device input signal 11 for giving a delay time to the device input signal 11 and produces a first delayed signal. The delay time is usually represented by a complex number. The first delayed signal has a first delayed signal amplitude and a first delayed signal phase which is different from the device input phase.

A first signal processing circuit 13 is connected to the first delay circuit 12. The first signal processing circuit 13 processes the first delayed signal into a first conjugate signal representative of a first conjugate complex number of the first complex number.

A first complex multiplier 14 is connected to the first signal processing circuit 13 and supplied with the device input signal 11. The first complex multiplier 14 calculates a first product of the first complex number and the first conjugate complex number and produces a first complex product signal representative of the first product. The first complex product signal has a first complex product signal amplitude.

A first low-pass filter 15 is connected to the first complex multiplier 14 and filters the first complex product signal into a first filtered signal having a first filtered signal amplitude. A first limiting circuit 16 is connected to the first-low-pass filter 15 and limits the first filtered signal amplitude to a first limited amplitude to produce a first limited signal having the first limited amplitude. The first limited signal has a first limited signal phase. A phase processing circuit 17 is connected to the first limiting circuit 16. The phase processing circuit 17 processes the first limited signal phase into a processed phase which is equal to the device input phase and thereby produces a phase processed signal representative of the processed phase.

A second complex multiplier 18 is connected to the phase processing circuit 17 and supplied with a multiplier input signal which will be described below. The second complex multiplier 18 calculates a second product of the phase processed signal and the multiplier input signal to produce a second complex product signal representative of the second product representative of a second complex number.

A second delay circuit 19 is connected to the second complex multiplier 18 and delays the second complex product signal to produce a second delayed signal having a second delayed signal amplitude. A second limiting circuit 20 is connected to the second delay circuit 19 and limits the second delayed signal amplitude to a second limited amplitude. The second limiting circuit 20 supplies the second complex multiplier 18 through a delay circuit output line 201 with a second limited signal which has the second limited amplitude and is used as the multiplier input signal.

A second signal processing circuit 21 is connected to the second complex multiplier circuit 18 and processes the second complex product signal into a second conjugate signal representative of s second conjugate complex number of the second complex number. A third complex multiplier 22 is connected to the second signal processing circuit 21 and supplied with the device input signal 11. The third complex multiplier 22 calculates a third product of the first complex number and the second conjugate complex number and produces a third complex product signal representative of the third product.

A second low-pass filter 23 is connected to the third complex multiplier 22 to filter the third complex product signal into a second filtered signal. A fourth complex multiplier 24 is connected to the second complex multiplier 18 and the second low-pass filter 23. The fourth complex multiplier 24 calculates a fourth product of the second complex product signal and the second filtered signal and produces a fourth complex product signal 25 representative of the fourth product. The fourth product signal 25 is a phase locked signal having a fourth complex signal phase as the locked phase into which the device input phase is locked.

The device input signal 11 is defined by a function U(t) which will be represented by a polar representation. Hereunder, the polar representation will be used in all equations.

$$U(t) = Ae^{j(\omega(i)t + \theta(i))} + N(t) \tag{1}$$

In Equation (1), A represents an amplitude of the device input signal 11, j represents the imaginary unit, $\omega(i)$ represents an angular frequency, $\theta(i)$ represents a phase angle of the device input phase, t represents time, and N(t) is a function which represents by the polar representation a level of noise superposed no the device input signal 11 at the time t.

When the device input signal 11 is sampled by a sequence of timing pulse signals of a sample period T, an n-th sample value U(n) of an n-th sample of the device input signal 11 is represented by:

$$U(n) = Ae^{j(\omega(i)Tn + \theta(i))} + N(nT). \tag{2}$$

Produced by the first delay circuit 12, the first delayed signal will be represented by $U_{12}(n-D)$ which is given by:

$$U_{12}(n-D) = Ae^{j\{\omega(i)T(n-D) + \theta(i)\}} + N\{(n-D)T\},$$

where D represents the number of samples between the n-th sample of the device input signal 11 and a delayed sample to which the n-th sample is delayed.

Produced by the first signal processing circuit 13, the first conjugate signal will be represented by $U_{13}(n-D)$ which is given by:

$$U_{13}(n-D) = U_{12}*(n-D),$$

where * represents the conjugate complex value of a complex number.

Produced by the first complex multiplier 14, the first complex product signal will be represented by $U_{14}(n; D)$ which is given by:

$$U_{14}(n; D) = U(n)U_{13}(n-D) = U(n)U_{12}*(n-D). \tag{3}$$

The device input signal U(t) is rewritten into:

$$U(t) = S(t) + N(t), \tag{4}$$

by substituting S(t) for $Ae^{j(\omega(i) + \theta(i))}$.

From Equations (3) and (4):

$$U_{14}(n;D) = S(n)S*(n-D) + S(n)N*(n-D) + S*(n-D)N(n) + N(n)N*(n-D). \tag{5}$$

Inasmuch as the first low-pass filter 15 averages the first complex product signal $U_{14}(n; D)$, each of the second and the third terms on the right-hand side of Equation (5) becomes equal to zero. In this event, the fourth term on the right-hand side of Equation (5) becomes equal to zero when the number of samples D is large. As a result, Equation (5) is rewritten into:

$$U_{15}(n-D) = S(n)S*(n-D) = A^2 e^{j\omega(i)TD},$$

Produced by the first limiting circuit 16, the first limited signal will be represented by $U_{16}(n-D)$ which is given by:

$$U_{16}(n-D) = [U_{15}(n-D)]/A^2 = e^{j\omega(i)TD}.$$

Produced by the phase processing circuit 17, the phase processed signal will be represented by $U_{17}(n)$ which is given by:

$$U_{17}(n) = e^{j\omega(i)TD/D} = e^{j\omega(i)T}. \tag{6}$$

Produced by the second complex multiplier 18, the second complex product signal will now be assumed as:

$$U_{18}(n) = e^{j\phi(n)}. \tag{7}$$

where $\phi(n)$ represents a temporarily assumed phase which the n-th sample of the device input signal 11 will have in the second complex product signal.

Produced by the second delay circuit 19, the second delayed signal will be represented by $U_{19}(n-1)$ which is given by:

$$U_{19}(n-l) = e^{j\phi(n-l)}.$$

Produced by the second limiting circuit 20, the second limited signal will be represented by $U_{20}(n-1)$ which is given by:

$$U_{20}(n-l) = e^{j\phi(n-l)}, \tag{8}$$

neglecting limitation of the amplitude of the second delayed signal.

Using Equations (6) and (8), the second complex product signal $U_{18}(n)$ is given by:

$$U_{18}(n) = U_{17}(n)U_{20}(n-l) = e^{j\omega(i)Tn} \times e^{j\phi(n-l)}.$$

In Equation (8), it will be assumed that the number of samples D is equal to only one. In this event, the temporarily assumed phase $\phi(n)$ is represented by:

$$\phi(n) = \omega(i)Tn + \phi(o). \tag{9}$$

By using Equations (7) and (9), Equation (6) is rewritten into:

$$\begin{aligned} U_{18}(n) &= e^{j\{\omega(i)Tn + \phi(0)\}} \\ &= e^{j\omega(i)Tn} \times e^{j\phi(0)}. \end{aligned} \tag{10}$$

Produced by the second signal processing circuit 21, the second conjugate signal is represented by $U_{21}(n)$ which is given by:

$$U_{21}(n) = U_{18}{}^*(n).$$

Produced by the third complex multiplier 22, the third complex product signal will be represented by $U_{22}(n)$ which is given by:

$$\begin{aligned} U_{22}(n) &= U(n)U_{21}(n) = U(n)U_{18}{}^*(n) \\ &= Ae^{j\theta(i)} \times e^{-j\phi(0)} + \\ &\quad N(nT)e^{-j\{\omega(i)Tn + \phi(0)\}}. \end{aligned}$$

Produced by the second low-pass filter 23, the second filtered signal will be represented by $U_{23}(n)$ which is given by:

$$U_{23}(n) = Ae^{j\theta(i)}xe^{-j\phi(O)}. \tag{11}$$

Produced by the fourth complex multiplier 24, the fourth complex product signal will be represented by $U_{24}(n)$. Using Equations (10) and (11), the fourth complex product signal $U_{24}(n)$ is given by:

$$U_{24}(n) = U_{18}(n)U_{23}(n) = Ae^{j\{\omega(i)Tn + \theta(i)\}}. \tag{12}$$

By comparing Equations (2) and (12), it will be understood that the fourth complex product phase is equal to the device input signal phase $\theta(i)$.

In connection with the above, the first complex product signal $U_{14}(n; D)$ includes a desired direct-current signal component which is represented by the first term on the right-hand side of Equation (5). It should be to understand that the third complex product signal $U_{22}(n)$ is another desired direct-current signal component as a whole. Such signal components flow through the first and the second low-pass filters 15 and 23 with no attenuation. The fourth complex multiplier 24 can therefore select the signal components embedded in the noise superposed on the device input signal 11 and at considerably large frequency offsets.

Thus, the illustrated example of the embodiment of the invention provides a powerful tool to select a line frequency component in a phase lock mode of operation without the phase-locking difficulties inherent in conventional phase lock techniques.

Many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, accordingly all suitable modifications and equivalents may be resorted to as falling within the scope of the invention.

What is claimed is:

1. A phase-lock loop device for phase locking a device input signal representing a first complex number and having a device input phase which should be locked into a locked phase, said phase-lock loop device comprising:

a first delay circuit supplied with said device input signal for delaying said device input signal by a delay time to produce a first delayed signal having a first phase;

a first signal processing circuit connected to said first delay circuit for processing said first delayed signal into a first conjugate signal representative of a first conjugate complex number of said first complex number;

a first complex multiplier connected to said first signal processing circuit for calculating a first product of said first complex number and said first conjugate complex number to produce a first complex product signal representative of said first product;

a first low-pass filter connected to said first complex multiplier for filtering said first complex product signal into a first filtered signal having said first phase;

phase processing means connected to said first low-pass filter for processing said first phase into a processed phase which is equal to said device input phase, said phase processing means thereby producing a phase processed signal representative of said processed phase;

a second complex multiplier connected to said phase processing means and supplied with a multiplier input signal for calculating a second product of said phase processed signal and said multiplier input signal, said second product being representative of a second complex number, said second complex multiplier thereby producing a second complex product signal representative of said second product;

a second delay circuit connected to said second complex multiplier for delaying said second complex product signal to produce a second delayed signal having a delayed signal amplitude;

limiting means connected to said second complex multiplier and said second delay circuit for limiting said delayed signal amplitude into a limited amplitude to deliver a limited signal having said limited amplitude to said second complex multiplier as said multiplier input signal;

a second signal processing circuit connected to said second complex multiplier for processing said second complex product signal into a second conjugate signal representative of a second conjugate complex number of said second complex number;

a third complex multiplier connected to said second signal processing circuit and supplied with said device input signal for calculating a third product of said first complex number and said second conjugate complex number to produce a third complex product signal representative of said third product;

a second low-pass filter connected to said third complex multiplier for filtering said third complex product signal into a second filtered signal; and a fourth complex multiplier connected to said second complex multiplier and said second low-pass filter for calculating a fourth product of said second complex product signal and said second filtered signal to produce a fourth complex product signal representative of said fourth product, said fourth complex product signal having said locked phase.

2. A phase-lock loop device as claimed in claim 1, wherein said first filtered signal has a first filtered signal amplitude, and wherein said phase processing means comprises:
a limiting circuit connected to said first low-pass filter for limiting said first filtered signal amplitude to a restricted amplitude to produce a restricted signal having said restricted amplitude and said first phase; and a phase processing circuit connected to said limiting circuit for processing said first phase into said processed phase, said phase processing circuit producing said phase processed signal representing said processed phase and having said restricted amplitude.

3. A method for phase locking a device input signal representing a first complex number and having a device signal phase to be locked into a locked phase, comprising the steps of:

(a) delaying said device input signal to produce a first delayed signal having a first phase;

(b) signal processing said first delayed signal into a first conjugate signal representative of a first conjugate complex number of said first complex number;

(c) multiplying said first complex number and said first conjugate complex number to produce a first product representative of a first complex product signal;

(d) filtering said first complex product signal into a first filtered signal having said first phase;

(e) phase processing said first phase into a processed phase which is equal to said device input phase to produce a phase processed signal;

(f) multiplying said phase processed signal and a feedback signal to produce a second complex product signal which is representative of a second complex number;

(g) delaying said second complex product signal to produce a second delayed signal having a delayed signal amplitude;

(h) limiting said delayed signal amplitude of said second delayed signal to produce said feedback signal;

(i) signal processing said second complex product signal into a second conjugate signal representative of a second conjugate complex number of said second complex number;

(j) multiplying said first complex number and said second conjugate complex number to produce a third complex product signal;

(k) filtering said third complex product signal into a second filtered signal; and (l) multiplying said second complex product signal and said second filtered signal to produce a fourth complex product signal having said locked phase.

4. A method as claimed in claim 3,
wherein said first filtered signal has a first filtered signal amplitude, and
wherein said phase processing step (e) comprises the steps of:
limiting said first filtered signal amplitude to a restricted amplitude to produce a restricted signal having said restricted amplitude and said first phase; and
phase processing for processing said first phase into said processed phase to produce said phase processed signal representing said processed phase and having said restricted amplitude.

5. A device for phase locking a device input signal representing a first complex number and having a device signal phase to be locked into a locked phase, said device comprising:
means for delaying said device input signal to produce a first delayed signal having a first phase;
means for signal processing said first delayed signal into a first conjugate signal representative of a first conjugate complex number of said first complex number;
means for multiplying said first complex number and said first conjugate complex number to produce a first product representative of a first complex product signal;
means for filtering said first complex product signal into a first filtered signal having said first phase;
phase processing means for phase processing said first phase into a processed phase which is equal to said device input phase to produce a phase processed signal;
means for multiplying said phase processed signal and a feedback signal to produce a second complex product signal which is representative of a second complex number signal;
means for delaying said second complex product signal to produce a second delayed signal having a delayed signal amplitude;
means for limiting said delayed signal amplitude of said second delayed signal to produce said feedback signal;
means for a signal processing said second complex product signal into a second conjugate signal representative of a second conjugate complex number of said second complex number;

means for multiplying said first complex number and said second conjugate complex number to produce a third complex product signal;

means for filtering said third complex product signal into a second filtered signal; and means for multiplying said second complex product signal and said second filtered signal to produce a fourth complex product signal having said locked phase.

6. A device as claimed in claim 5,
wherein said first filtered signal has a first filtered signal amplitude, and wherein said phase processing means comprises:
a limiting circuit for limiting said first filtered signal amplitude to a restricted amplitude to produce a restricted signal having said restricted amplitude and said first phase; and a phase processing circuit for processing said first phase into said processed phase, said phase processing circuit producing said phase processed signal representing said processed phase and having said restricted amplitude.

* * * * *